United States Patent [19]

Schaefer

[11] Patent Number: 5,457,659
[45] Date of Patent: Oct. 10, 1995

[54] PROGRAMMABLE DYNAMIC RANDOM ACCESS MEMORY (DRAM)

[75] Inventor: Scott Schaefer, Boise, Id.

[73] Assignee: Micron Technology, Inc., Boise, Id.

[21] Appl. No.: 276,993

[22] Filed: Jul. 19, 1994

[51] Int. Cl.$^6$ .................................................. G11C 7/00
[52] U.S. Cl. .................... 365/222; 365/191; 365/193; 365/189.05; 365/230.03; 365/238.5
[58] Field of Search .............................. 365/222, 189.05, 365/191, 193, 201, 230.03, 235, 238.5

[56] References Cited

U.S. PATENT DOCUMENTS

| | | | |
|---|---|---|---|
| 5,262,998 | 11/1993 | Mnich et al. | 365/222 |
| 5,303,180 | 4/1994 | McAdams | 365/63 |
| 5,327,387 | 7/1994 | Sugiura et al. | 365/222 |
| 5,349,566 | 9/1994 | Merritt et al. | 365/189.05 X |

Primary Examiner—David C. Nelms
Assistant Examiner—Huan Hoang
Attorney, Agent, or Firm—Stephen A. Gratton

[57] ABSTRACT

A DRAM which adapted to provide extended data output upon the input of appropriate logic signals is provided. The DRAM includes a CAS before RAS (CBR) detection circuit that controls the data output during a CBR refresh cycle. The operation of the CBR detection circuit is dependent on the state of the output enable (OE) signal during a CBR refresh cycle (e.g., WE-high, CAS-low, RAS-high then low while CAS low). If OE is low, then the CBR detection circuit will trigger a first output mode for the data out buffer (e.g., normal fast page output mode in a non-persistent version and the programmed mode in a persistent version) along with a refresh pulse to the refresh controller. If OE is high then the CBR detection circuit will trigger an extended data output from the data out buffer.

18 Claims, 6 Drawing Sheets

PROGRAMMABLE DYNAMIC RANDOM ACCESS MEMORY (DRAM)

FIELD OF THE INVENTION

This invention relates to semiconductor memory devices and more particularly to a DRAM that can be selectively programmed to provide an extended data out (EDO) feature.

BACKGROUND OF THE INVENTION

Dynamic Random Access Memories (DRAMs) include an array of memory cells contained on a semiconductor integrated circuit chip (ICs). The memory cells are arranged in rows and columns (e.g., 1-Mbit, 4-Mbit, 16-Mbit, 64-Mbit). Each cell stores a bit of information by the presence or absence of an electric charge on a capacitor. In a DRAM, refresh circuitry is provided for "refreshing" the stored charge (i.e., restoring to full charge a capacitor that is partially discharged).

With the latter generations of DRAMs, various device options have been offered by semiconductor manufacturers to the customers who use the DRAMs in their electronic equipment. These device options provide different functional characteristics in a memory device and can be used to improve the performance of a DRAM or its suitability for a particular application.

A large percentage (e.g., over 90%) of DRAMs are sold with a fast page mode function and are termed fast page mode DRAMs. A fast page mode operation in a DRAM allows faster data operations within a row address defined page boundary. In general, this is accomplished by holding the row address ($\overline{RAS}$) signals low and strobing in different column addresses ($\overline{CAS}$) signals to execute faster memory cycles.

Another performance option in a DRAM is known as extended data out, or sometimes referred to as hyper page mode. A DRAM that includes this feature is termed an EDO DRAM. With an EDO DRAM, blocks of data can be outputted from the DRAM similar in fashion to the Fast-Page Mode DRAM but at a faster cycle rate. This is accomplished because the $\overline{CAS}$ signal, transitioning high, no longer controls the output buffer thereby providing for pipelined data flow. This allows data to be read and processed faster. In general, an extended output is accomplished by configuring a DRAM, such as a fast page mode DRAM, so that the $\overline{CAS}$ signal no longer tristates the I/O buffer when $\overline{CAS}$ goes into precharge.

Two other types of DRAM are known as a write per bit (WPB) DRAM and a static column DRAM. A write per bit (WPB) DRAM is configured with a $\overline{RAS/WE}$ key and mask register to provide latching mask data if $\overline{WE}$ is low when $\overline{RAS}$ transitions from a high to a low which the mask is now able to define which data inputs will be allowed to be passed through on the subsequent $\overline{CAS}$ transitions (low). A static column DRAM is configured similar to a Fast-Page-Mode DRAM with the exception that the column address buffer does not latch the data at $\overline{CAS}$ time ($\overline{CAS}$ going low) thereby eliminating the need for tCAC (i.e., access time from CAS). This provides faster page cycles since the $\overline{CAS}$ signal is no longer required to release data from the DRAM. A WPB DRAM and a static column DRAM can also be configured to have an extended data output.

These various device options in a DRAM typically utilize the same memory array but require different interface circuitry for addressing, enabling output and refreshing the memory cells within the memory array. The interface circuitry includes logic gates and CMOS transfer devices formed on board the chip to produce a desired circuit arrangement. The desired option is typically implemented during wafer fabrication utilizing appropriate mask sets to construct the required circuitry.

One disadvantage of this approach is inflexibility. The configuration of the chip is set at the time of manufacture and cannot be changed. A manufacturer must therefore fabricate large numbers of different wafers to produce the different types of chips needed to satisfy different markets. This increases product development costs and the time to market for a product. Similarly, customers who use ICs may be required to inventory several different types of chips for use in their products.

Another approach is to include all of the device options in one basic mask set and then derive the desired final configuration of the chip in the assembly operations. As an example, with bond programming, the chip configuration may be selected by either bonding to a pad or leaving the pad open. For achieving the desired circuit configuration, a bonded pad may connect to certain circuitry and an unbonded pad may be taken to a default potential. U.S. Pat. No. 5,303,180 to McAdams describes such a bond programming arrangement. Programmable links such as fuses and laser actuated links are also sometimes used to effect a device option.

These approaches are also somewhat inflexible and cannot always be easily implemented by a customer. What is needed is a method for selecting different performance options in a DRAM that does not require expensive manufacturing or assembly operations.

Accordingly, it is an object of the present invention to provide a DRAM configured with different performance options that can be enabled using appropriate logic signals. It is another object of the present invention to provide a DRAM such as a fast page mode DRAM, a WPB DRAM or a static column DRAM that can be configured as an EDO DRAM upon the input of appropriate logic signals.

SUMMARY OF THE INVENTION

In accordance with the invention, a DRAM that can be configured with an extended data output upon the input of appropriate logic signals is provided. The DRAM includes a $\overline{CAS}$ before $\overline{RAS}$ (CBR) detection circuit that controls the data output during a CBR refresh cycle.

The CBR detection circuit is connected to a refresh controller and also to a data out buffer for the DRAM. The operation of the CBR detection circuit is dependent on the state of the output enable ($\overline{OE}$) signal during a CBR refresh cycle (e.g., $\overline{WE}$-high, $\overline{CAS}$-low, $\overline{RAS}$-high then low while $\overline{CAS}$ low). If $\overline{OE}$ is low, then the CBR detection circuit will trigger a first output mode for the data out buffer (e.g., normal fast page output mode) along with a refresh pulse to the refresh controller. If $\overline{OE}$ is high then the CBR detection circuit will trigger an extended data output from the data out buffer. The configuring of the EDO option can be either with a persistent or a non persistent refresh. If persistent, once EDO is programmed, the command is no longer required until power is removed. A CBR with $\overline{OE}$ low will perform a CBR refresh (either as a Fast Page Mode or an EDO DRAM) and the first CBR with $\overline{OE}$ high will configure the DRAM as an EDO DRAM (but no refresh performed, although an option could be made to allow it to be performed) with all subsequent CBR with $\overline{OE}$ high commands ignored. If non-persistent, each CBR command would be a refresh command and either define a Fast-Page Mode/Static Column/WPB ($\overline{OE}$ low) or an EDO Mode ($\overline{OE}$ high).

The DRAM may be configured as a fast page mode DRAM, a write per bit DRAM or a static column DRAM. In each case data output from the DRAM can be switched to an extended data output mode depending on the state of OE during a CBR refresh cycle.

Other objects, advantages and capabilities of the present invention will become more apparent as the description proceeds.

DETAILED DESCRIPTION OF THE PREFERRED EMBODIMENT

As used herein the term fast page mode DRAM refers to a dynamic memory device in which input signals are addressed into different columns in a predetermined row of memory cells.

An EDO DRAM refers to a dynamic memory device in which data is outputted without the constraints of the CAS control pin.

A WPB DRAM refers to a dynamic memory device in which the data being transferred may be masked (ignored) as programmed during RAS time.

A static column DRAM refers to a dynamic memory device in which the column address buffer is not latched.

Figure 1:
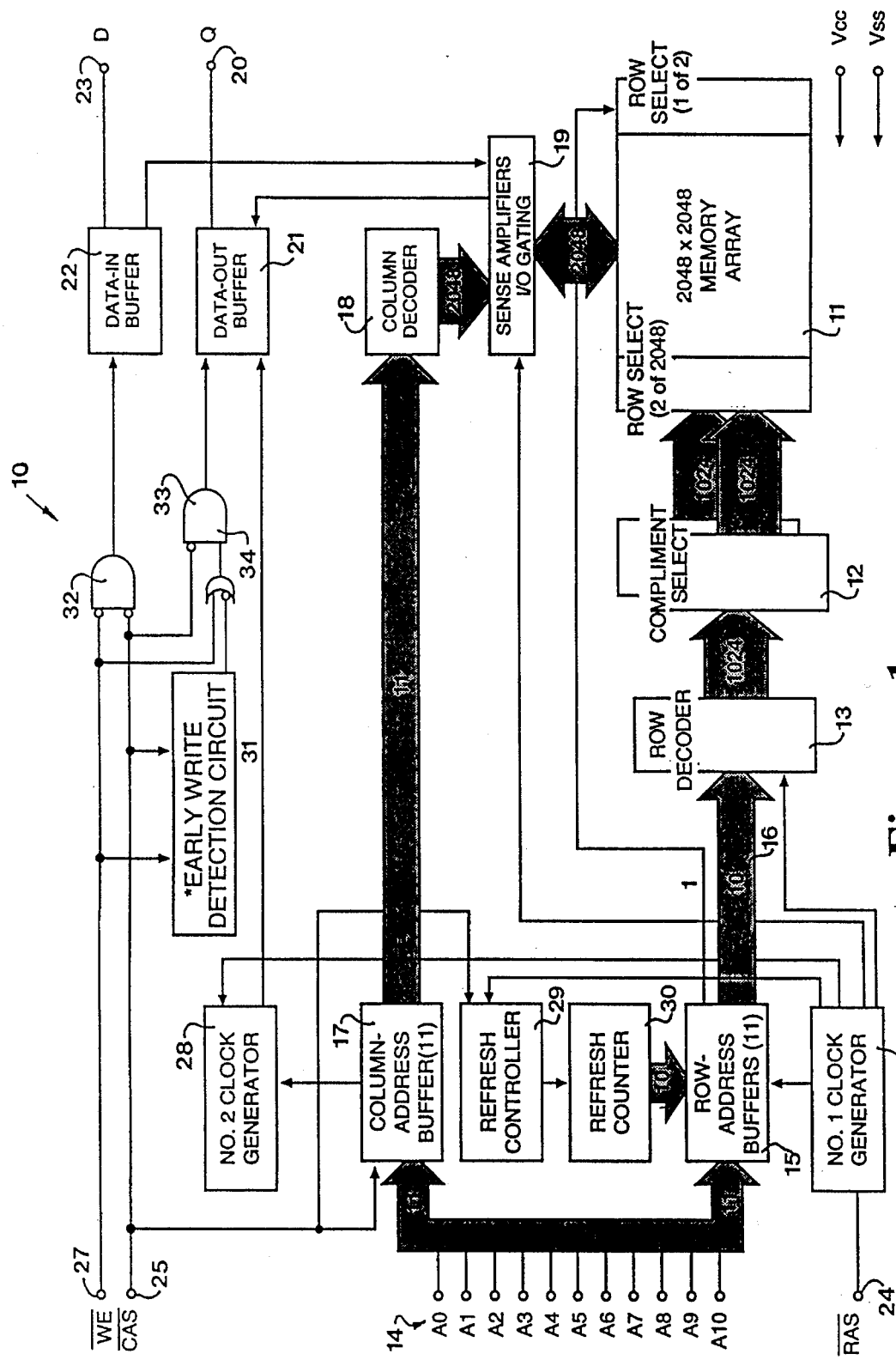
FIG. 1 is an electrical diagram in block form of a fast page mode DRAM which may use features of the invention according to one embodiment.

Referring now to FIG. 1, a DRAM 10 which may utilize features of the present invention is shown. The DRAM 10 is in the form of a semiconductor integrated circuit chip constructed as a fast page mode DRAM. The DRAM 10 includes a 4-Mbit memory cell array 11 arranged in a x1 configuration of 2048 rows and columns. Other suitable sizes for a cell array include 1-Mbit, 16M-bit and 64M-bit. In addition, the cell arrays can be arranged in various other configurations (e.g., x2, x4, x8, x16)

The cell array 11 is addressed by row and column address circuitry including a compliment select 12 and a row decoder 13. These components receive row address signals from address pins 14 and row address buffers 15 though a row address bus 16. The address is multiplexed, so a column address is also applied via the address pins 14 and column address buffer 17 to a column decoder 18. The columns of the cell array 11 (i.e., bit lines) are connected to sense amplifiers 19 and to the column decoder 18 which selects some number of bits for input or output during a given write or read cycle. All of the sense amplifiers 19 are activated on every active read or write cycle and on every refresh cycle. Input/output gating is also associated with the sense amplifiers 19. The sense amplifiers 19 and I/O gating are connected to a data-out buffer 21 and to a data-in buffer 22. The data-in buffer 22 is connected to a data-in pin 23. The data-out buffer 21 is connected to a data-out pin 20.

The multiplexed addresses are accepted from the address pins 14 into the address buffers 15 under control of row and column address strobes $\overline{RAS}$ and $\overline{CAS}$. These logic signals are applied to $\overline{RAS}$ pin 24 and $\overline{CAS}$ pin 25. The $\overline{RAS}$ address strobes are applied to a No. 1 clock generator 26 which generates internal clocks for driving the address buffers 15, the row decoder 13 and the sense amplifiers 19. The No. 1 clock generator 26 is also connected to a No. 2 clock generator 28 that coordinates signals to the data out buffer 21. In addition, the No. 1 clock generator 26 is connected to a refresh controller 29 and a refresh counter 30 that control operation of the refresh cycle. An early write detection circuit 31 along with logic gates 32, 33 and 34 are connected, substantially as shown, to a $\overline{WE}$ pin 27 for receiving write enable signals and to the $\overline{CAS}$ pin 25 for receiving column address signals. The EW detection circuit will "lockout" and prevent any READs from occurring if $\overline{WE}$ transitions low prior to $\overline{CAS}$ going low. If $\overline{WE}$ goes low after $\overline{CAS}$ goes low, both a READ and a WRITE could occur.

The selection of what operation is being performed in an active cycle is controlled by the $\overline{WE}$ pin 27. If the $\overline{WE}$ pin 27 is active-low, the cycle is a WRITE cycle and data will be accepted from the input pins 23 and written to the memory array 11 via the sense amplifiers 19. If the $\overline{WE}$ is inactive-high, the cycle is a READ cycle. During a READ cycle data extracted from the memory array 11 via the sense amplifiers 19 will be driven onto the data output pin 20.

During READ or WRITE cycles, each bit is uniquely addressed through the address pins 14 which are entered 11 bits at a time. $\overline{RAS}$ is used to latch the first 10 bits and CAS the latter 10 bits. During a WRITE cycle, data at data-in pin 23 is latched by the falling edge of $\overline{WE}$ or $\overline{CAS}$, whichever occurs last. If $\overline{WE}$ goes low prior to $\overline{CAS}$ going low, the output at data-out pin 20 remains open (high Z) until the next $\overline{CAS}$ cycle. If $\overline{WE}$ goes low after data reaches the data output pins 20, the output is activated and retains the selected cell data as long as $\overline{CAS}$ remains low (regardless of $\overline{WE}$ or $\overline{RAS}$). This late $\overline{WE}$ pulse results in a READ-WRITE cycle.

Returning $\overline{RAS}$ and $\overline{CAS}$ high terminates a memory cycle and decreases chip current to a reduced standby level. Also the chip is preconditioned for the next cycle during the RAS high time. Memory cell data is retained in its correct state by maintaining power and executing any $\overline{RAS}$ cycle (READ, WRITE, RAS ONLY, CAS-BEFORE-RAS, or HIDDEN refresh) so that all combinations of RAS addresses are executed at least every 15 ms.

PAGE MODE operations allow faster data operations (READ, WRITE or READ-MODIFY-WRITE) within a row address defined page boundary. The PAGE MODE cycle is always initiated with a row address strobed in by $\overline{RAS}$ followed by a column address strobed in by $\overline{CAS}$. By holding $\overline{RAS}$ low, $\overline{CAS}$ may be toggled strobing in different column addresses executing faster memory cycles. Returning $\overline{RAS}$ high terminates the PAGE MODE operation.

These functions are summarized in the following truth table.

is triggered. With $\overline{OE}$ low the CBR refresh pulse is not triggered but the EDO pulse is triggered in the persistent version. The non-persistent version would also generate the

TRUTH TABLE

| Function | $\overline{RAS}$ | $\overline{CAS}$ | $\overline{WE}$ | TF | Addresses tR | tC | |
|---|---|---|---|---|---|---|---|
| Standby | H | H | H | GND/NC | X | X | High Impedance |
| READ | L | L | H | GND/NC | ROW | COL | Data Out |
| WRITE (EARLY-WRITE) | L | L | L | GND/NC | ROW | COL | Data In |
| READ-WRITE | L | L | H→L→H | GND/NC | ROW | COL | Valid Data Out, Valid Data In |
| PAGE-MODE READ | L | H→L→H | H | GND/NC | ROW | COL | Valid Data Out, Valid Data Out |
| PAGE-MODE WRITE | L | H→L→H | L | GND/NC | ROW | COL | Valid Data In, Valid Data In |
| PAGE-MODE READ-WRITE | L | H→L→H | H→L→H | GND/NC | ROW | COL | Valid Data Out, Valid Data In |
| RAS ONLY REFRESH | L | H | H | GND/NC | ROW | n/a | High Impedance |
| HIDDEN REFRESH | L→H→L | L | H | GND/NC | ROW | COL | Valid Data Out |
| CAS-BEFORE-RAS REFRESH | H→L | L | H | GND/NC | X | X | High Impedance |

The cell array 11 employs one-transistor dynamic memory cells wherein data bits are stored on capacitors. Because these capacitors leak, the data must be refreshed periodically (e.g., every 15 milliseconds). Several refresh mechanisms are available in DRAMs currently marketed. Figure A illustrates a conventional $\overline{CAS}$ before $\overline{RAS}$ refresh that is accomplished using the CBR detection circuit 35 shown in FIG. 2.

Figure 2:
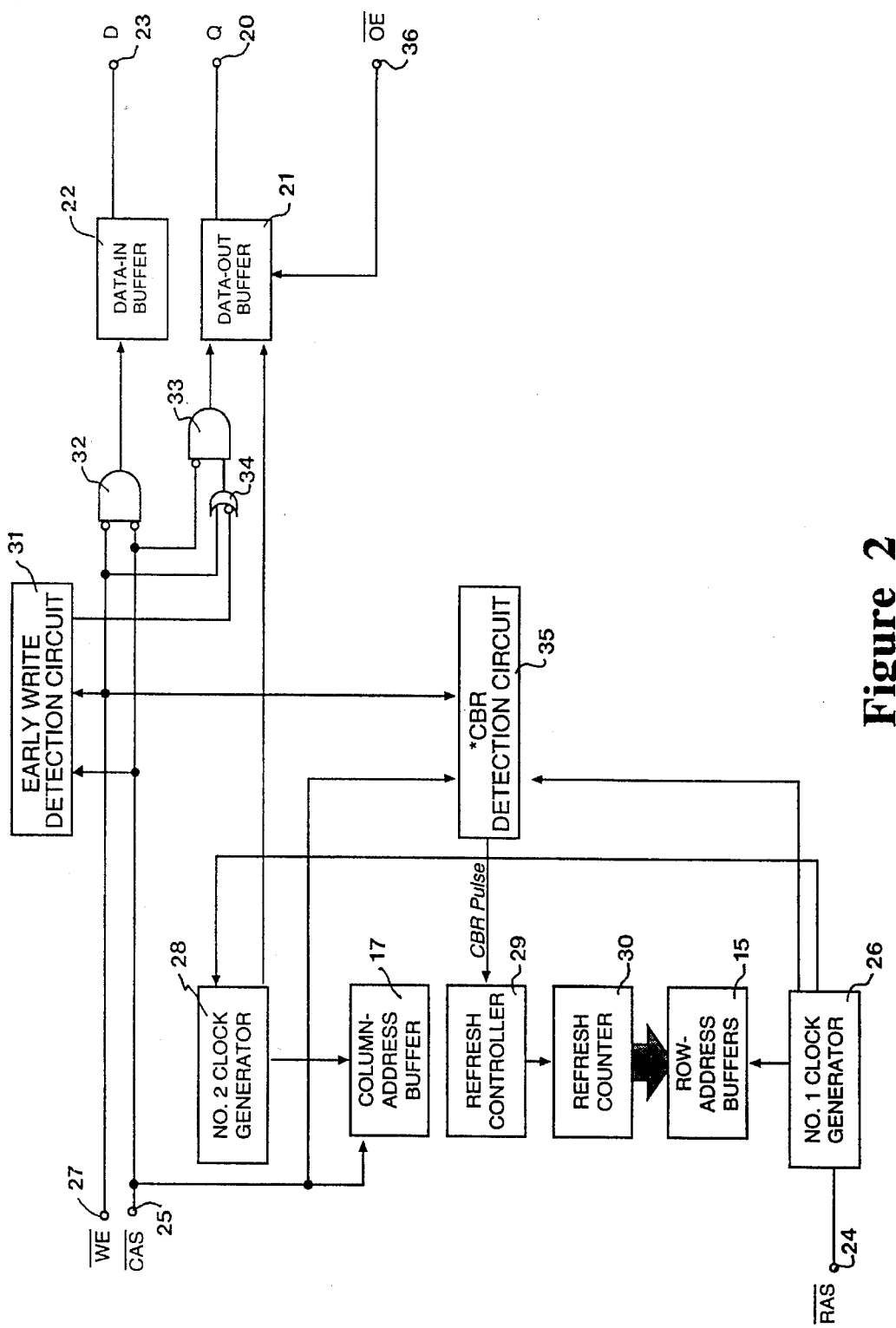
FIG. 2 is an electrical diagram in block form of a portion of a prior art fast page mode DRAM illustrating the CBR detection circuit.
Figure 2A:
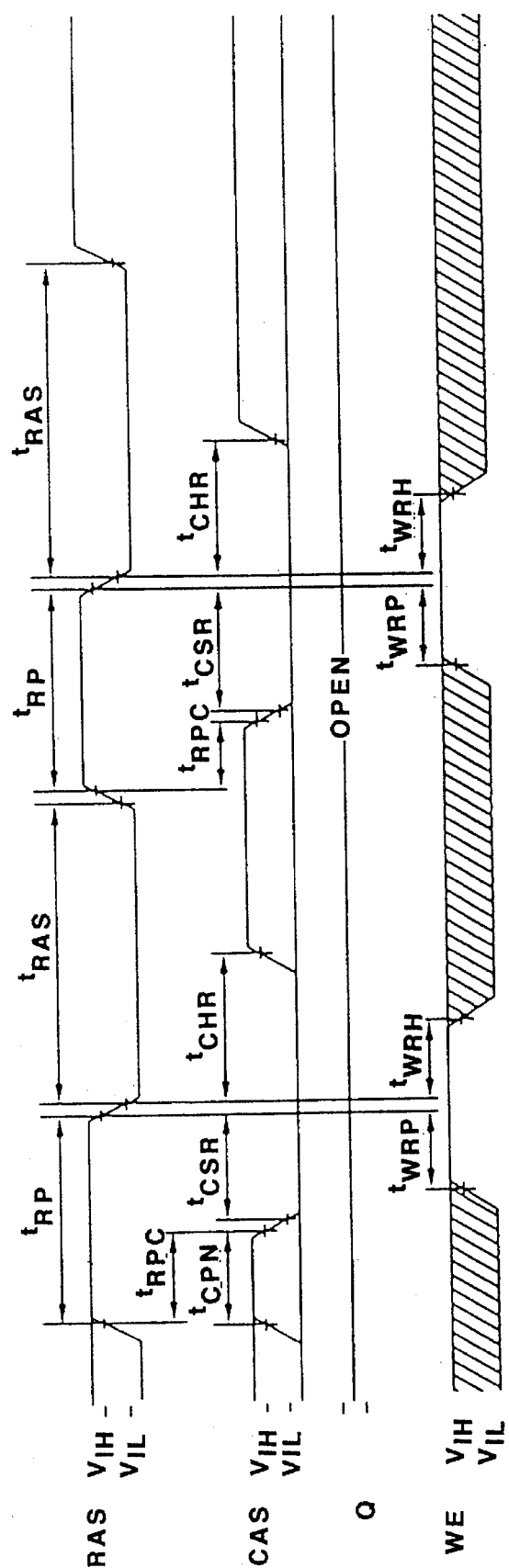
FIG. 2A is a timing diagram in which voltage is plotted as a function of time, illustrating the events occurring in the device of FIG. 2 during a CBR refresh cycle.

The CBR detection circuit 35 is connected to the No. 1 clock generator 26, to the $\overline{CAS}$ pin 25 and to the refresh controller 29, substantially as shown in FIG. 2. In addition, an output enable $\overline{OE}$ signal is applied to the data-out buffer 21 through an $\overline{OE}$ pin 36 to establish when the data-out buffer 21 is allowed to drive the data out pin 20. Only when $\overline{OE}$ is active-low can the data out pin 20 be driven by the data-out buffer 21.

If $\overline{CAS}$ falls before $\overline{RAS}$ this signals a refresh cycle in which the row address for refresh is held in the refresh counter 30. There is no data input or output during this operation, and no address is accepted. The $\overline{WE}$ signal must be high, signaling a CBR refresh ($\overline{WE}$ low would initiate a JEDEC test mode operation), when $\overline{RAS}$ falls for this type of refresh operation (i.e., $\overline{WE}$-high, $\overline{CAS}$-low, $\overline{RAS}$-high then low while $\overline{CAS}$ low). The $\overline{OE}$ signal is ignored (i.e., "don't care") in a standard $\overline{CAS}$ before $\overline{RAS}$ refresh. There may be only one refresh cycle if $\overline{RAS}$ and $\overline{CAS}$ return to the high level, or there may be a continuous sequence of refresh cycles performed if $\overline{RAS}$ is toggled every 15-milliseconds (max) and $\overline{CAS}$ is held low.

Figure 3:
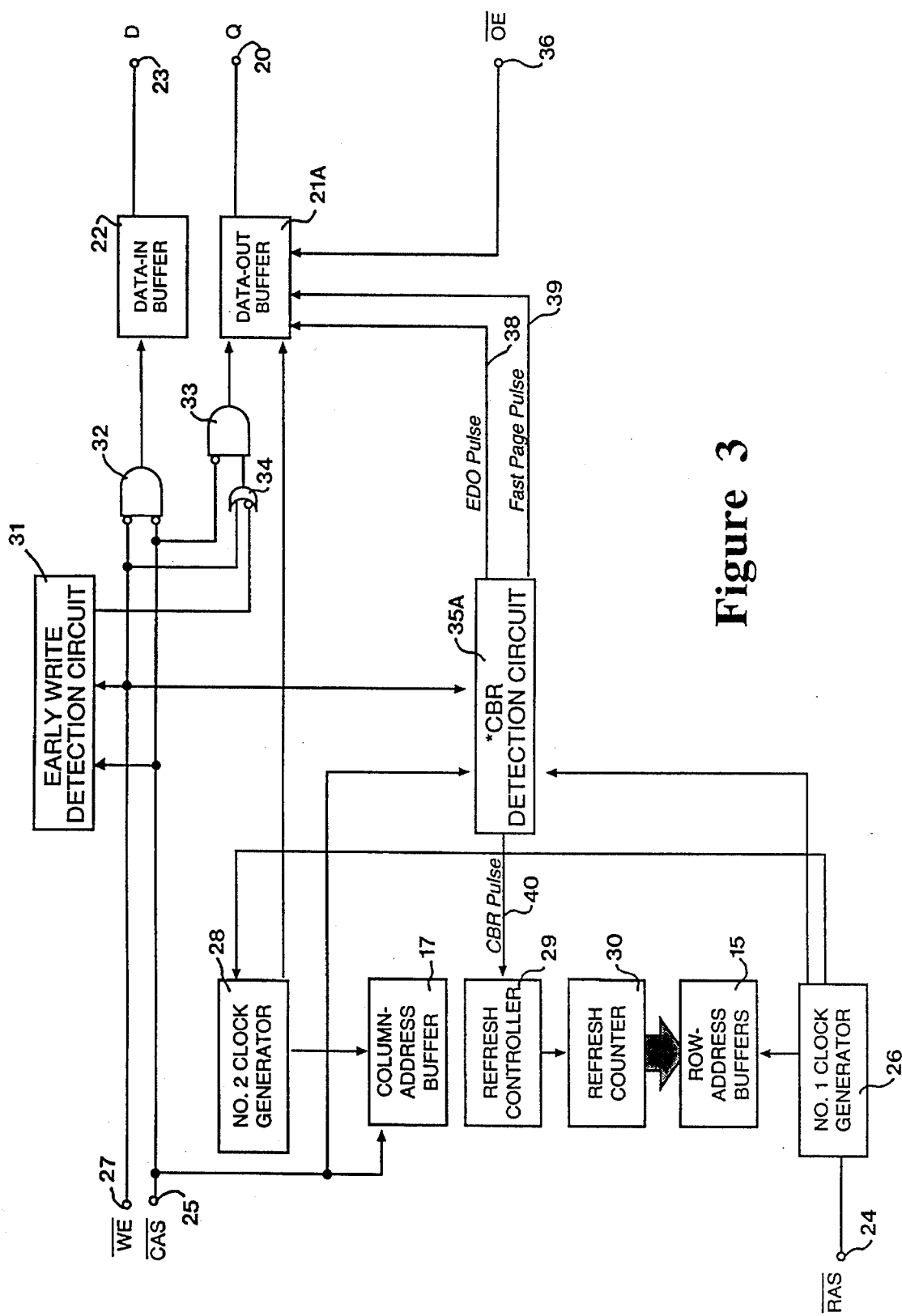
FIG. 3 is an electrical diagram in block form of a portion of a fast page mode DRAM constructed in accordance with the invention illustrating a CBR detection circuit adapted to trigger an EDO pulse or a fast page pulse depending on the state of $\overline{OE}$.

Referring now to FIG. 3, a DRAM constructed in accordance with the invention is shown. In accordance with the invention, the CBR detection circuit 35A of a DRAM is constructed such that the data-out buffer 21A is triggered with an EDO pulse 38 or a fast page pulse 39. The state of the $\overline{OE}$ pin 36 (high or low) in effect controls the mode of the data out (fast page or EDO).

The fast page pulse 39 is triggered only when $\overline{OE}$ is high (and EDO has not been invoked for the first time in the persistent version). At the same time a CBR refresh pulse 40 refresh command. In both cases, the $\overline{CAS}$ before $\overline{RAS}$ refresh is as previously described (i.e., $\overline{WE}$-high, $\overline{CAS}$-low, $\overline{RAS}$-high then low while $\overline{CAS}$ low).

Figure 3A:
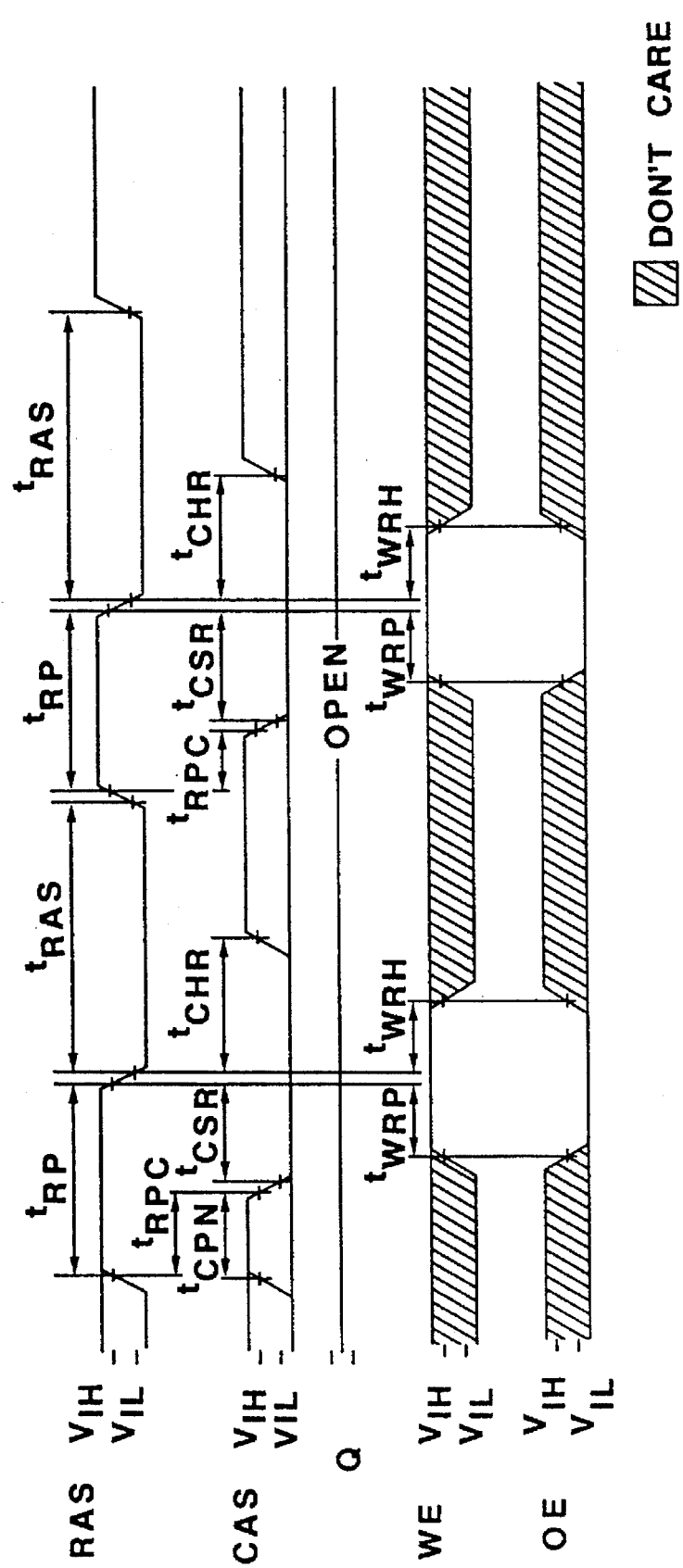
FIG. 3A is a timing diagram in which voltage is plotted as a function of time, illustrating the events occurring in the device of FIG. 3 during a CBR refresh cycle with $\overline{OE}$ high.

FIG. 3A illustrates the timing and state of $\overline{RAS}$, $\overline{CAS}$ and $\overline{WE}$ for simultaneously triggering a CBR refresh pulse and a fast page pulse.

Figure 3B:
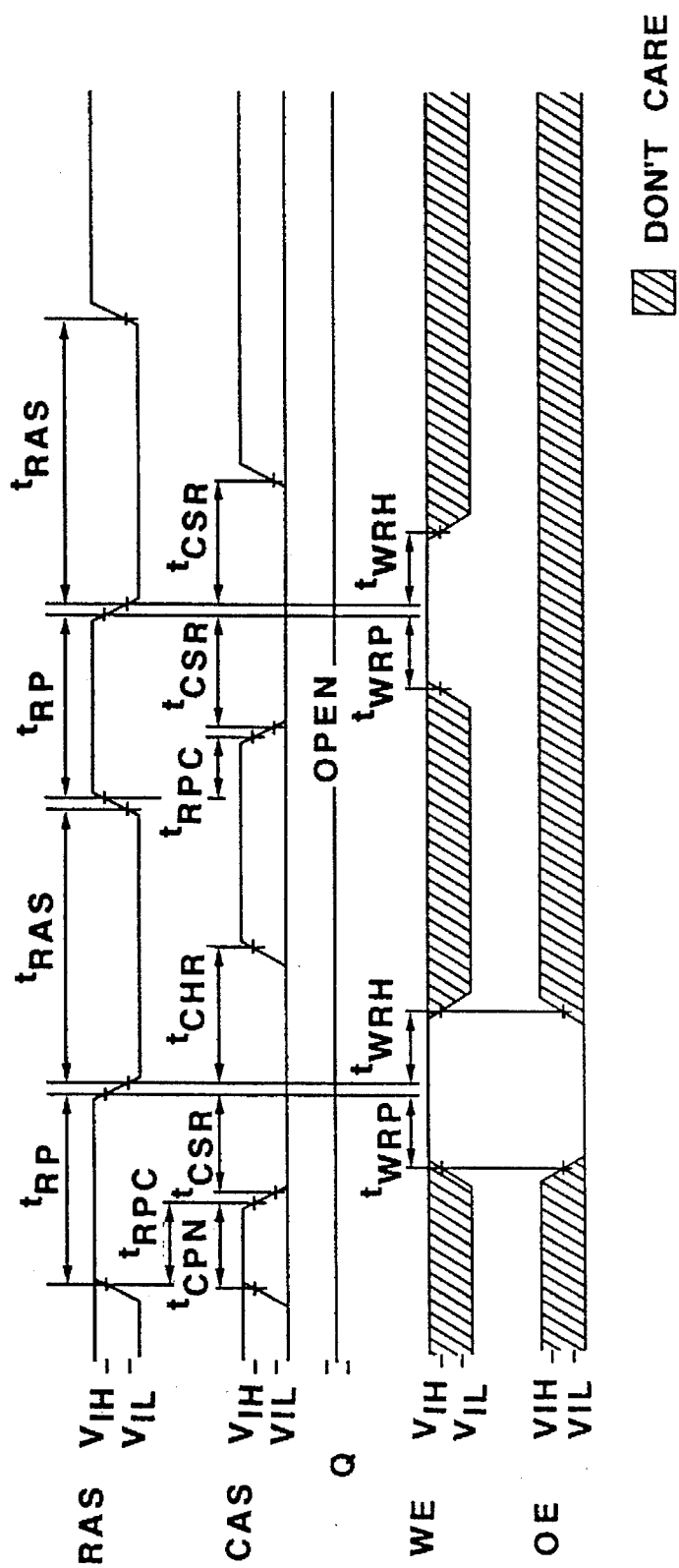
FIG. 3B is a timing diagram in which voltage is plotted as a function of time, illustrating the events occurring in the device of FIG. 3 during a CBR refresh cycle with $\overline{OE}$ low.

FIG. 3B illustrates the timing and state of $\overline{RAS}$, $\overline{CAS}$ and $\overline{WE}$ for triggering an EDO pulse instead of a CBR refresh pulse.

In FIGS. 3A and 3B:

$V_{IH}$ is input high (Logic 1) voltage $V_{IL}$ is input low (Logic 0) voltage $t_{RP}$ is $\overline{RAS}$ precharge time $t_{RAS}$ is $\overline{RAS}$ pulse width $t_{RPC}$ is $\overline{RAS}$ to $\overline{CAS}$ precharge time $t_{CPN}$ is $\overline{CAS}$ precharge time $t_{CSR}$ is $\overline{CAS}$ set up time $t_{CHR}$ is $\overline{CAS}$ hold time $t_{WRP}$ is $\overline{WE}$ setup time $t_{WRH}$ is $\overline{WE}$ hold time Logic signals thus control the operation of the CBR detection circuit 35A to provide an EDO pulse 38 or a fast page pulse 39.

Thus the invention can be used to provide a DRAM that can be operated in one mode (e.g., fast page mode) and also operated as an EDO DRAM with the input of proper logic signals. Although the invention has been described in an illustrative embodiment for a fast page mode DRAM, the same principles can be used to construct a WPB DRAM or a static column DRAM to be configurable as an EDO DRAM.

Thus the invention has been described with reference to certain preferred embodiments, as will be apparent to those skilled in the art, certain changes and modifications can be made without departing from the scope of the invention as defined by the following claims.

What is claimed is:

1. A dynamic memory device comprising:

a memory array including memory cells arranged in columns and rows;

row address means responsive to a row address strobe and column address means responsive to a column address strobe for addressing predetermined memory cells in the memory array;

refresh means for generating a refresh signal when a write enable signal, column address strobe and row address strobe are each at a predetermined voltage and timing sequence relative to one another and for refreshing data stored in the memory cells;

data-out means responsive to an output enable signal for transmitting data from selected memory cells;

data-in means responsive to the write enable signal for transmitting data to selected memory cells; and detection means responsive to occurrence of the refresh signal, said detection means adapted to operate the data-out means in a first mode when the output enable signal is at a first voltage and in a second mode when the output enable signal is at a second voltage.

2. The device as claimed in claim 1 and wherein the second mode is an extended data out mode in which blocks of data are transmitted simultaneously.

3. The device as claimed in claim 1 and wherein the refresh signal is initiated when the write enable signal is at high voltage, column address strobe is at low voltage, and row address strobe is at high then low voltage while column address strobe is at low voltage.

4. The device as claimed in claim 1 and wherein the memory cells are refreshed when a first pulse is triggered.

5. The device as claimed in claim 1 and wherein the device is configured as a fast page mode device with an extended data output in the second mode.

6. The device as claimed in claim 1 and wherein the device is configured as a write per bit device with an extended data output in the second mode.

7. The device as claimed in claim 1 and wherein the device is configured as a static column device with an extended data output in the second mode.

8. A fast page mode dynamic random access memory device that can be configured with an extended data output, comprising:

a memory array including memory cells arranged in columns and rows;

row address means responsive to a row address strobe and column address means responsive to a column address strobe for addressing predetermined memory cells and predetermined columns of memory cells within a row;

refresh means responsive to a refresh signal in which a write enable signal, column address strobe and row address strobe are each at a predetermined voltage and timing sequence relative to one another for refreshing data stored in the memory cells of the memory array during a refresh cycle;

data-out means associated with the column address means and row address means and responsive to an output enable signal for transmitting data from the memory cells to a data-out pin;

data-in means associated with the column address means and row address means and responsive to the write enable signal for transmitting data from a data-in pin to the memory cells; and detection means responsive to occurrence of the refresh cycle said detection means adapted to trigger a first pulse to the data-out means when the output enable signal is at a first voltage to initiate data output and a second pulse to the data-out means when the output enable signal is at a second voltage to initiate blocks of data output.

9. The device as claimed in claim 8 and wherein the refresh signal is initiated when the write enable signal is at high voltage, column address strobe is at low voltage, and read address strobe is at high then low voltage while column address strobe is at low voltage.

10. The device as claimed in claim 8 and wherein the memory cells are refreshed when the first pulse is triggered.

11. The device as claimed in claim 8 and wherein the refresh means refresh the memory cells persistently.

12. In a dynamic random access memory device having a memory array arranged in rows and columns addressable through address pins and a data-in pin during a read cycle to produce output signals at an output pin during an output cycle, a method for configuring the output signals from the memory array comprising:

detecting a voltage of an output enable signal during a refresh cycle for the memory array;

generating a first pulse to the output pin when the output enable signal is at first voltage to enable a first mode of data output; and generating a second pulse to the output pin when the output enable signal is at a second voltage to enable a second mode of data output.

13. The method as claimed in claim 12 and wherein the second mode of data output is an extended data output wherein blocks of data are outputted.

14. The method as claimed in claim 12 and wherein the refresh cycle occurs when write enable is at high voltage, column address strobe is at low voltage, and read address strobe is at high then low voltage while column address strobe is at low voltage.

15. The method as claimed in claim 12 and wherein the first voltage is output enable high and the second voltage is output enable low.

16. The method as claimed in claim 12 and wherein the first mode of data output follows a fast page mode address.

17. The method as claimed in claim 12 and wherein the first mode of data output follows a write per bit address.

18. The method as claimed in claim 12 and wherein the first mode of data output follows a static column address.

* * * * *